United States Patent [19]

Rhodes

[11] Patent Number: 4,742,016
[45] Date of Patent: May 3, 1988

[54] METHOD OF MANUFACTURE OF A TWO-PHASE CCD

[75] Inventor: Howard E. Rhodes, Webster, N.Y.

[73] Assignee: Eastman Kodak Company, Rochester, N.Y.

[21] Appl. No.: 31,975

[22] Filed: Mar. 30, 1987

[51] Int. Cl.$^4$ ............................................. H01L 29/78
[52] U.S. Cl. ......................................... 437/37; 437/53; 437/239; 357/24
[58] Field of Search ........................ 437/29, 30, 53, 37

[56] References Cited

U.S. PATENT DOCUMENTS

| | | | |
|---|---|---|---|
| 4,027,381 | 6/1977 | Tasch, Jr. et al. | 437/37 |
| 4,027,382 | 6/1977 | Tasch, Jr. et al. | 437/37 |
| 4,035,906 | 7/1977 | Tasch et al. | 437/37 |
| 4,227,202 | 10/1980 | Tasch, Jr. et al. | 357/24 |
| 4,228,445 | 10/1980 | Tasch, Jr. et al. | 357/24 |
| 4,229,752 | 10/1980 | Hynecek | 357/24 |

Primary Examiner—O. Chaudhuri
Attorney, Agent, or Firm—Raymond L. Owens

[57] ABSTRACT

The fabrication of a two-phase buried channel silicon CCD involves the use of arsenic diffusion out of selected regions of an overlying oxide layer into selected portions of a buried channel in the underlying silicon intended to serve as the storage region of the first phase set of polysilicon gate electrodes. To eliminate various problems, the oxide layer into which the arsenic is implanted for later outdiffusion is grown in a wet oxidizing ambient, and the arsenic implantation is followed with a restore oxide anneal step involving heating at a moderate temperature before the later outdiffusion by heating at a high temperature. Additionally, an oxide layer intended to serve as the gate oxide underlying a second-phase set of polysilicon gate electrodes is formed by heating the wafer in a dry oxidizing ambient.

10 Claims, 2 Drawing Sheets

METHOD OF MANUFACTURE OF A TWO-PHASE CCD

FIELD OF THE INVENTION

This invention relates to the manufacture of two-phase charge coupled devices (CCDs) and more particularly to manufacture of such CCDs by a process which involves the implantation of arsenic ions into a silicon oxide layer overlying the upper surface of a silicon substrate and the subsequent diffusion of the arsenic ions out of the oxide layer into the underlying substrate.

BACKGROUND OF THE INVENTION

A popular process for the manufacture of two-phase charge coupled devices involves the implantation of arsenic selectively into a silicon oxide layer on the surface of a silicon substrate for subsequent outdiffusion from the oxide layer into the underlying silicon substrate.

Devices of this kind using diffusion out of the oxide to control the doping in the underlying silicon to control the channel potential of the silicon are found susceptible to several problems.

A first problem arises from charge trapping in the oxide due to residual arsenic that does not diffuse completely out of the oxide. Such charge trapping can cause threshold voltage shifts, drift in operating characteristics and low breakdown voltages in the finished device.

A second problem arises because the diffusion rate of the arsenic out of the oxide tends to vary so that the channel potential resulting from the diffusion is poorly reproducible.

A third problem is the occurrence of potential defects associated with arsenic diffusion out of the oxide under the first-phase set of gate electrodes. Such defects can reduce the efficiency of charge transfer and seriously degrade device performance.

SUMMARY OF THE INVENTION

The present invention seeks to reduce the problems associated with the diffusion of arsenic out of the oxide into the underlying silicon.

In particular, the process of the invention includes various features to deal with the problems described.

In particular, it is found that if the oxide in which the arsenic ions are implanted for subsequent outdiffusion is grown in a wet oxidizing ambient rather than a dry oxidizing ambient, the charge trapping problem described is substantially reduced with inappreciable reduction of the oxide breakdown strength.

The second and third problems described were found to be appreciably reduced by a restore oxide anneal step after arsenic implantation into the oxide and before the outdiffusion heating step. This anneal involves heating in oxygen at a moderately high temperature, for example, between 800°–950° C., and preferably at 900° C. for 30 minutes. This anneal appears to force the arsenic in the oxide into a stable diffusing state that is reproducible and well controllable. Additionally, to reduce these problems, it also appears to be advantageous to grow the second oxide, which is to underlie the second phase, or later-formed, set of gate electrodes in an essentially dry oxidizing ambient, for example pure oxygen.

Alternatively or additionally, problems two and three may be ameliorated by use of phosphorus implanted into the substrate for forming the buried channel used in the common form of two phase CCD.

In one aspect this invention is directed to, in the manufacture of a two-phase charge coupled device, forming an elongated buried channel in a p-type portion of a monocrystalline silicon wafer comprising the steps of:

(a) growing a first silicon oxide layer over a surface of the channel in a wet oxidizing ambient;

(b) implanting arsenic ions into selected regions of the silicon oxide layer to form arsenic-implanted oxide regions;

(c) heating the wafer at a moderately high temperature for putting the arsenic ions in a stable diffusing state;

(d) forming first-phase set of electrodes on said silicon oxide layer so that one edge of the electrodes overlaps one edge portion of an arsenic implanted oxide region and the other edge portion of the arsenic-implanted oxide region overlaps the other edge of the electrode, leaving a portion of each arsenic-implanted region exposed;

(e) masking the exposed portion of the arsenic-implanted oxide region, leaving exposed unimplanted portions of the silicon oxide layer;

(f) implanting arsenic ions through the exposed unimplanted portions of the silicon oxide layer into the underlying channel;

(g) removing the masking;

(h) removing the portions of the silicon oxide layer not covered by the first-phase set of electrodes;

(i) heating the wafer in a dry oxidizing ambient to form a second oxide layer over the channel between the first-phase set of electrodes and over the first-phase set of electrodes; and (j) depositing the second-phase set of electrodes to overlap edges of the first-phase set of electrodes and to contact the second oxide layer between the first-phase set of electrodes.

In another aspect this invention is directed to, in the manufacture of a two-phase charge-coupled device, the process of forming an elongated buried channel in a p-type substrate of a monocrystalline silicon wafer by implanting phosphorus ions into the substrate comprising the steps of:

(a) growing a first silicon oxide layer over a surface portion of the substrate in a wet oxidizing ambient;

(b) implanting arsenic ions into selected regions of the silicon oxide layer;

(c) forming first phase set of polysilicon electrodes on said silicon oxide layer so that one edge of each electrode overlaps one edge portion of the arsenic implanted oxide region and the other edge portion of the arsenic-implanted oxide region overlaps the other edge of the electrode and is exposed;

(d) masking the exposed portion of the arsenic-implanted oxide region, leaving exposed unimplanted portions of the silicon oxide layer;

(e) implanting arsenic ions through the exposed unimplanted portions of the silicon oxide layer into the underlying substrate;

(f) removing the masking;

(g) removing the portions of the silicon oxide layer not covered by the first-phase set of electrodes;

(h) heating the substrate in an oxidizing ambient to form a second oxide layer over the substrate between the first phase electrodes and over the first phase electrodes; and (i) depositing the second phase electrodes to overlap edges of the first phase electrodes and to contact the second oxide layer between the first-phase set of electrodes.

BRIEF DESCRIPTION OF THE DRAWINGS

The invention will be better understood from the following more detailed description taken with the accompanying drawings.

Figure 1:
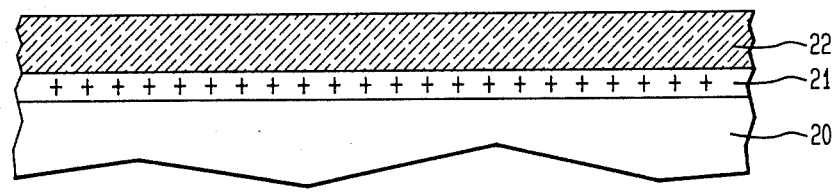
FIGS. 1 through 6 illustrate the basic sequence of steps in an illustrative process in accordance with the invention.

It should be appreciated that for purposes of exposition, the drawing is not to scale since the various dimensions particularly in the vertical direction of the drawing are quite small.

DESCRIPTION OF PREFERRED EMBODIMENTS

With reference now to the drawing, FIG. 1 shows a portion of a silicon wafer having a p-type substrate wherein is to be formed a two-phase CCD. The substrate has an arsenic-implanted surface layer 21 which forms the buried channel used in the buried-channel form of two-phase CCD. The localized arsenic ions are designated by + signs. After appropriate cleaning, over this wafer there is grown the first gate oxide layer 22 to the thickness desired for the first gate oxide, typically about 500 Angstroms. It is characteristic of the preferred embodiment of the invention that this oxide is grown wet, for example in an oxidizing ambient that includes water vapor or hydrogen. Oxidizing techniques using such ambients are well known. Advantageously, the ambient may include water vapor and hydrochloric acid at about 950° C. By this expedient, there is reduced the tendency for the arsenic, to be implanted into this oxide layer and remaining therein after the outdiffusion step, to form trapping centers which deleteriously affect efficient charge transfer in the device.

Figure 2:
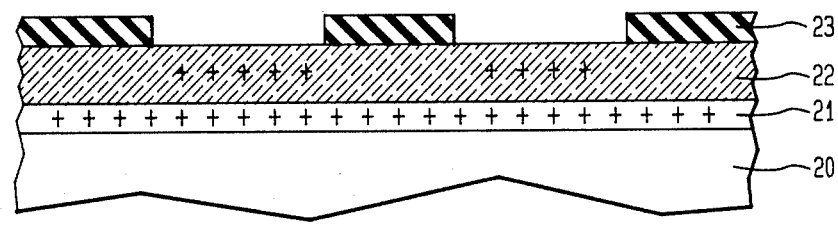

Next, as seen in FIG. 2, a mask 23 is formed over the grown silicon oxide layer to localize the implantation of arsenic into the oxide layer. This mask can be formed in conventional fashion by depositing a photoresist which is patterned photolithographically to expose the underlying silicon oxide where arsenic is desirably implanted. The regions of arsenic implantation correspond to the desired storage regions of the CCD. The implanted arsenic ions are shown in the oxide layer 22 by the +signs.

For one specific design of CCD, the arsenic is implanted at a dosage of $8 \times 10^{12}$ ions/cm$^2$ and at a voltage of 40 KEV. It is important that the implant be confined to the oxide with substantially no penetration to the substrate.

Moreover, to reduce the uncontrolled diffusion of arsenic out of the gate oxide into the underlying silicon, which as previously discussed is deleterious, it has been found advantageous to follow the arsenic implantation with an annealing step in oxygen at moderately high temperatures. The purpose of this restore oxide anneal is to force the arsenic into a diffusing state that is reproducible and controllable. To achieve this purpose, the temperature must be high enough to be effective but low enough that long range arsenic diffusion does not occur. A temperature of about 900° C. for about 20 minutes in pure oxygen is found especially effective.

It has also been found advantageous to clean the wafer both before and after this annealing step with about a ten second rinse in a 100-1 dilute hydrofluoric acid solution.

Figure 3:
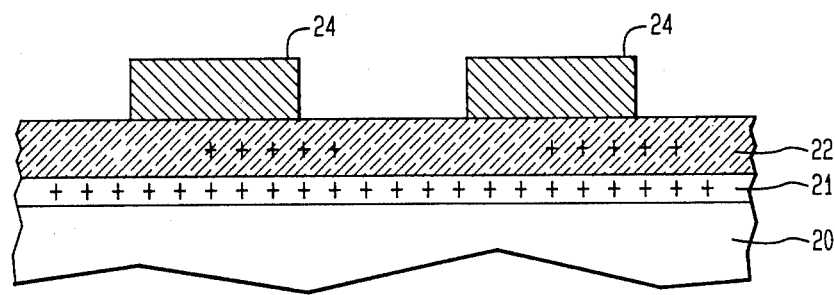

After removal of the mask 23, there is deposited over the oxide layer 22 the first-phase set of gate electrodes 24, advantageously of polysilicon, as is usual in such devices. This is done in conventional fashion by depositing a uniform layer of polysilicon suitably doped and of appropriate thickness, typically 3000 Angstroms and then patterning the layer appropriately. As seen in FIG. 3 the left edge of each gate electrode 24 overlaps the left edge portion of an arsenic implanted oxide region while the right edge of each electrode is overlapped by the right edge portion of the arsenic-implanted oxide region.

Figure 4:
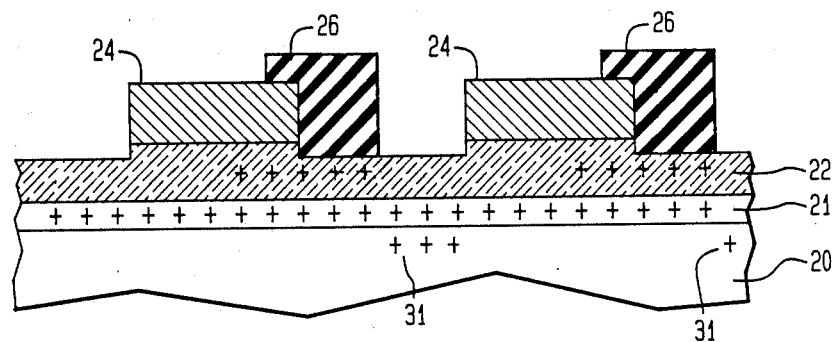

Next, advantageously the silicon oxide layer exposed between the electrodes 24 is partially etched back, as seen in FIG. 4, to a reduced thickness, typically about 200 Angstroms, in a dilute hydrofluoric acid solution.

Next, there needs to be defined the storage region under the second-phase set of gate electrodes. To this end, there is formed in conventional fashion over the wafer another mask 26 patterned to cover the rightmost edge of each of the polysilicon electrodes and also the arsenic-implanted region of the oxide layer, as seen in FIG. 4.

This is followed by a second arsenic implant directly into the substrate where not shielded either by the first-phase polysilicon electrode 24 or the mask 26, as designated by the second row of + signs 31 in the substrate. The second arsenic implant is of an energy sufficiently high that the ions largely pass through etched-back first gate oxide into the underlying silicon substrate, largely into the buried channel. Typically this involves implantation of a dosage of $1.2 \times 10^{12}$ ions at, 200 KEV voltage.

Figure 5:
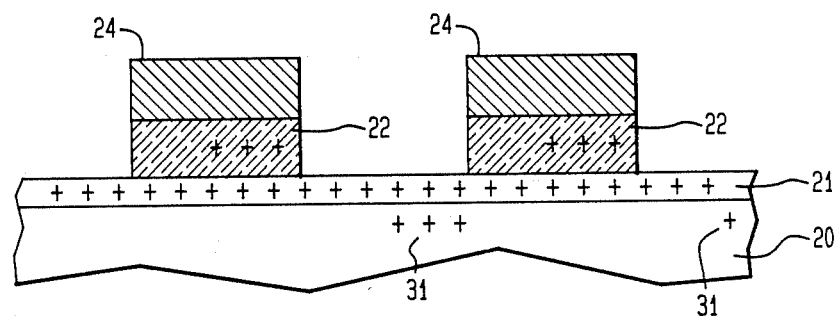

Next after removal of the mask 26, there is etched back the remainder of the first gate oxide layer not protected by the polysilicon electrode 24 and the resultant is shown in FIG. 5. The purpose of this second etch-back is to align the edge of the arsenic implant in the oxide layer 22 to the right edge of polysilicon electrode 24.

Next, the wafers are cleaned and the second oxide layer is grown both over the exposed regions of the substrate lying between the electrodes 24 and over the exposed surfaces of the electrodes 24. The choice of polysilicon for the first-phase set of electrodes makes this convenient. However, in accordance with a feature of the invention, this second oxide layer, grown to a thickness of about 500 Angstroms, is grown dry, i.e., in an oxidizing ambient free of water vapor or hydrogen chloride, such as pure oxygen at about 950° C. Oxidation techniques of this kind are known.

However, it has been found that the combination of this dry oxidation step and the earlier described restore oxide anneal step serves to reduce the two problems previously discussed.

There remains the formation of the second phase set of gate electrodes to realize a two phase CCD. To this end, a layer of suitably doped polysilicon, typically about 3000 Angstroms thick, is deposited in over the wafer, and then patterned in conventional fashion to arrive at the structure shown in FIG. 6. The second phase gate electrodes 28 overlap the edges of the first gate electrodes 24 and are electrically isolated therefrom by the grown oxide layers 29.

Next, typically there are formed the input and output connections to the channel region (not shown) in the usual fashion. Such connections typically are heavily doped localized N-type regions at opposite ends of the channel.

Figure 6:
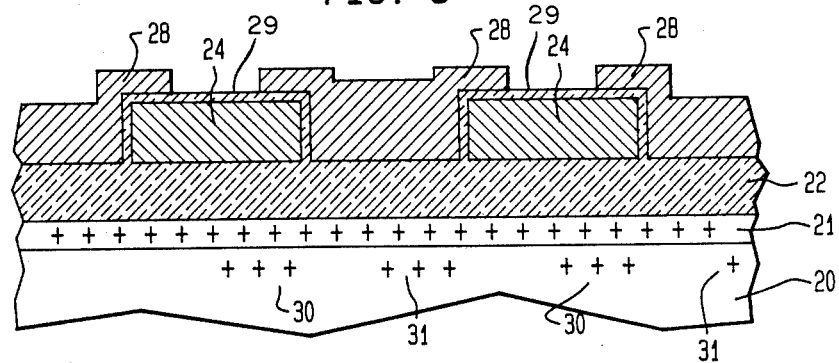

There remains a high temperature step used to diffuse the arsenic implanted in the first oxide layer out into the underlying silicon to establish the channel potential in the storage region of the first set of polysilicon electrodes. To minimize problems arising from variation of channel potentials in the storage region of the first-phase set of electrodes, it proved advantageous that the wafer be inserted into the anneal furnace at a low temperature, for example, about 950° C., ramped to 1050° C., annealed at this temperature for about 20 minutes, and then withdrawn from the furnace as the furnace temperature continues to drop to 950° C. In FIG. 6, the arsenic ions are shown diffused out of the oxide into the substrate underlying the right-most portion of the first storage electrode 24 as + signs 30. The arsenic ions earlier implanted into the storage regions of the second polysilicon electrodes 28 are shown as the + signs 31.

The provision of electrical connections to the various electrodes is done in conventional fashion and so will not be shown or described in detail. Typically, an aluminum layer is deposited and appropriately patterned for this purpose after provision of appropriate contact holes in the isolation layers provided over the polysilicon electrodes.

Additionally, it is usual to deposit passivation layers over the device but such layers also are not shown and will not be described.

It is to be understood that the specific process described is illustrative of the basic principles of the invention. Various modifications in the process described may be made without departing from the spirit and scope of the invention. In particular, considerable variation is possible in the dimensions and in the processing conditions not otherwise described as essential.

In particular, it appears that advantageous to further reduce undesired barriers and wells if the described process is modified to substitute phosphorus for the arsenic in the formation of the buried channel over the surface of the substrate, despite the fact that phosphorus diffuses more readily than arsenic so that the resulting channel will be much deeper and expected to result in reduced charge capacity of the CCD. However, the charge capacity may be in fact not reduced significantly because of the proximity of the arsenic which diffused out of the oxide now is located at the silicon-silicon oxide interface. By use of a phosphorus-doped buried channel, in some instances there may even be obviated the need for the restore oxide anneal step and or the dry ambient in the oxidization used to form the second oxide layer.

It is also feasible to utilize for the gate electrodes dual layers of polysilicon and silicide as discussed in concurrently filed, commonly assigned application Ser. No. 031,969, titled INTERLINE TRANSFER CHARGE COUPLED DEVICES.

The invention has been described in detail with particular reference to preferred embodiments thereof, but it will be understood that variations and modifications can be effected within the spirit and scope of the invention.

What is claimed is:

1. In the manufacturing of a two-phase charge coupled device, forming an elongated buried channel in a p-type portion of a monocrystalline silicon wafer comprising the steps of:

growing a first silicon oxide layer over a surface of the channel in a wet oxidizing ambient;

implanting arsenic ions into selected regions of the silicon oxide layer to form arsenic-implanted oxide regions;

heating the wafer at a moderately high temperature for putting the arsenic ions in a stable diffusing state;

forming first-phase set of electrodes on said silicon oxide layer so that one edge of the electrodes overlaps one edge portion of an arsenic implanted oxide region and the other edge portion of the arsenic-implanted oxide region overlaps the other edge of the electrode, leaving a portion of each arsenic-implanted region exposed;

masking the exposed portion of the arsenic-implanted oxide region, leaving exposed unimplanted portions of the silicon oxide layer;

implanting arsenic ions through the exposed unimplanted portions of the silicon oxide layer into the underlying channel;

removing the masking;

removing the portions of the silicon oxide layer not covered by the first-phase set of electrodes;

heating the wafer in a dry oxidizing ambient to form a second oxide layer over the channel between the first-phase set of electrodes and over the first-phase set of electrodes; and depositing the second-phase set of electrodes to overlap edges of the first-phase set of electrodes and to contact the second oxide layer between the first-phase set of electrodes.

2. The process of claim 1 in which the step of heating the wafer for putting the arsenic ions in a stable diffusing state is at about 900° Centigrade for about twenty minutes in essentially pure oxygen.

3. The process of claim 1 in which the step of implanting arsenic ions through the exposed unimplanted portions of the silicon oxide layer is preceded by a step of partially etching back said exposed unimplanted portions.

4. The process of claim 1 in which the elongated buried channel is formed by implanting phosphorus ions into the substrate.

5. The process of claim 1 in which the wet oxidizing ambient for forming the first oxide layer includes hydrogen ions.

6. The process of claim 1 in which the dry oxidizing ambient for forming the second oxide layer consists essentially of pure oxygen.

7. The process of claim 1 in which the elongated buried channel is formed by implanting phosphorus, the wet oxidizing ambient includes hydrogen ions, the dry oxidizing ambient consists essentially of pure oxygen, and the step of heating for putting the arsenic ions in the surface oxide layer in a stable diffusing state involves heating at about 900° Centigrade for about 20 minutes in essentially pure oxygen.

8. In the manufacture of a two-phase charge-coupled device, the process of forming an elongated buried channel in a p-type substrate of a monocrystalline silicon wafer by implanting phosphorus ions into the substrate comprising the steps of:

growing a first silicon oxide layer over a surface portion of the substrate in a wet oxidizing ambient;

implanting arsenic ions into selected regions of the silicon oxide layer;

forming first phase set of polysilicon electrodes on said silicon oxide layer so that one edge of each electrode overlaps one edge portion of the arsenic implanted oxide region and the other edge portion of the arsenic-implanted oxide region overlaps the other edge of the electrode and is exposed;

masking the exposed portion of the arsenic-implanted oxide region, leaving exposed unimplanted portions of the silicon oxide layer;

implanting arsenic ions through the exposed unimplanted portions of the silicon oxide layer into the underlying substrate;

removing the masking;

removing the portions of the silicon oxide layer not covered by the first-phase set of electrodes;

heating the substrate in an oxidizing ambient to form a second oxide layer over the substrate between the first phase electrodes and over the first phase electrodes; and depositing the second phase electrodes to overlap edges of the first phase electrodes and to contact the second oxide layer between the first-phase set of electrodes.

9. The process of claim 8 in which the first silicon oxide layer is grown in an ambient of water vapor.

10. The process of claim 8 further including the step in which the step of implanting arsenic ions through the exposed unimplanted portions of the silicon oxide layer is preceded by the step of partially etching back said exposed unimplanted portions.

* * * * *